United States Patent [19]
Grüning

[11] Patent Number: 5,729,446
[45] Date of Patent: Mar. 17, 1998

[54] CONVERTER CIRCUIT ARRANGEMENT WITH ACTIVELY CONTROLLABLE CURRENT AND VOLTAGE RISE LIMITING MEANS

[75] Inventor: Horst Grüning, Wettingen, Switzerland

[73] Assignee: Asea Brown Boveri AG, Baden, Switzerland

[21] Appl. No.: 670,899

[22] Filed: Jun. 26, 1996

[30] Foreign Application Priority Data

Jun. 26, 1995 [DE] Germany ............... 195 23 096.5

[51] Int. Cl.$^6$ ........................................... H02H 7/122
[52] U.S. Cl. ..................... 363/58; 363/54; 363/57
[58] Field of Search ........................ 363/52, 53, 54, 363/55, 56, 57, 58, 132, 136, 137

[56] References Cited

U.S. PATENT DOCUMENTS 4,366,522 12/1982 Baker ........................ 363/55
4,885,657 12/1989 Grüning ..................... 363/57
5,130,917 7/1992 Shekhawat ................. 363/56

FOREIGN PATENT DOCUMENTS 41 23 813 C2  3/1994  Germany.

OTHER PUBLICATIONS

Bosterling et. al. "Moderne Leistungshalbleiter In Der Stromrichtertechnik"; ETZ Bd. 114 (1993) Heft 21 pp. 1310–1319.
Japanese Abstract JP 5–304782 A; E–1513, Feb. 22, 1994; vol. 18, No. 109.

Primary Examiner—Jeffrey L. Sterrett
Attorney, Agent, or Firm—Oblon, Spivak, McClelland, Maier & Neustadt, P.C.

[57] ABSTRACT

A converter circuit arrangement is specified in which actively controllable current and voltage rise limiting means are provided in parallel with a semiconductor switch. These means also take over the function of a reverse-connected parallel diode and essentially comprise a bipolar transistor which is driven by a control circuit.

5 Claims, 4 Drawing Sheets

1

CONVERTER CIRCUIT ARRANGEMENT WITH ACTIVELY CONTROLLABLE CURRENT AND VOLTAGE RISE LIMITING MEANS

BACKGROUND OF THE INVENTION

1. Field of the Invention

The invention is concerned with the field of power electronics. It is based on a converter circuit arrangement according to the preamble of the first claim.

2. Discussion of Background

Such a circuit arrangement is well known and is described, for example, in the article "Moderne Leistungshalbleiter in der Stromrichtertechnik" [Modern power semiconductors in converter technology], etz vol. 114 (1993) No. 21, pages 1310 to 1319.

These circuit arrangements share the features that they are supplied by a DC voltage or current intermediate circuit and comprise at least one branch, consisting of a series circuit formed by an even number of semiconductor switches. The central node of the series circuit of the semiconductor switches forms a load terminal, to which a load, for example a motor, can be connected.

The semiconductor switches are turned on and off in such a way that an AC voltage having, for example, an adjustable frequency is output at the load. The semiconductor switches must be protected against excessively steep voltage and current slopes by means of a passive dV/dt and dI/dt snubber. In the prior art, this snubber comprises a network of passive elements such as snubber, inductors and resistors. This network is expensive and requires a great deal of space.

SUMMARY OF THE INVENTION

Accordingly, one object of the invention is to provide a novel converter circuit arrangement which manages with as few snubber elements as possible and therefore requires less space and is inexpensive to produce.

This object is achieved, in the case of a circuit arrangement of the type mentioned in the introduction, by means of the features of the first claim.

The core of the invention, therefore, is that actively controllable current and voltage rise limiting means are provided in parallel with the semiconductor switches. These means preferably comprise a bipolar transistor which is arranged in common base connection in parallel with the semiconductor switch. Consequently, the base of the bipolar transistor is connected to a first main electrode, assigned to a cathode, of the semiconductor switch and the collector is connected to a second main electrode, assigned to an anode, of the semiconductor switch. A control circuit is provided between the emitter and the base for the purpose of driving the bipolar transistor. Said control circuit drives the bipolar transistor in such a way that the latter is turned on, on the one hand, shortly before the semiconductor switch is turned off, for a first time interval and is turned on, on the other hand, before the semiconductor switch is turned on again, for a second time interval which lasts longer than the turn-on operation.

In this way, the bipolar transistor can actively limit the current rise and the voltage slope during turn-on of the branch and the gradient of the voltage slope during turn-off. Since the bipolar transistor can therefore be used selectively for both limiting functions, the outlay on components for the snubber becomes lower. The costs and the space requirement are thereby reduced.

Further exemplary embodiments emerge from the corresponding dependent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
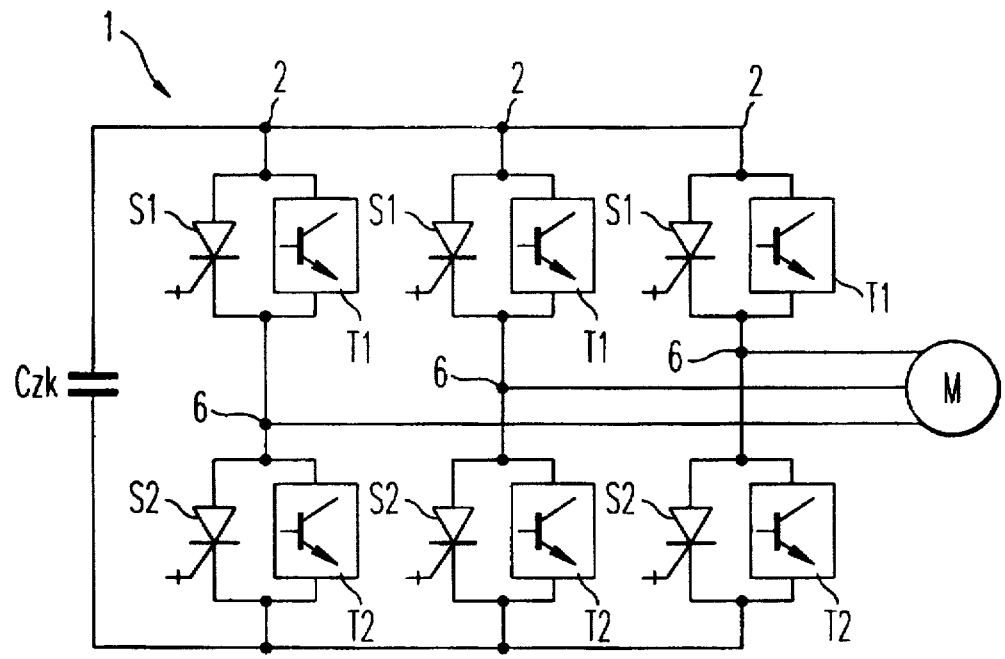
FIG. 1 shows a circuit arrangement of a three-phase invertor with a motor as load.

The reference symbols used in the drawings and their meaning are summarized in the list of designations.

DESCRIPTION OF THE PREFERRED EMBODIMENTS

Referring now to the drawings, wherein like reference numerals designate identical or corresponding parts throughout the several views, FIG. 1 shows the equivalent circuit diagram of a three-phase invertor 1. Said invertor is, for example, part of a voltage converter for supplying an electric motor M. A voltage converter of this type comprises a mains-fed rectifier (not illustrated), a DC voltage intermediate circuit (illustrated by the intermediate circuit capacitor Czk) and an invertor with the connected load. The invertor comprises a number of phases or branches 2, which each consist of a series circuit formed by an even number of semiconductor switches. An upper switch S1 and a lower switch S2 are illustrated for each branch. However, the invention is expressly not restricted to only two switches, rather it is also possible to provide more than two switches for each branch. The central, common node of the series circuit in this case forms a load terminal 6. The semiconductor switches S1 and S2 of the arrangement are now turned on and off according to known patterns by means of a drive circuit 5, with the result that a polyphase AC voltage is produced at the load. These driving methods are well known and do not require any further explanation.

Since the semiconductor switches S1 and S2 are generally non-reverse-conducting components, it is normally necessary to provide a reverse-connected parallel diode in parallel with the semiconductor switch. Said diode takes over the flow of current following commutation. The semiconductor switches, in particular GTOs as well, withstand only a limited gradient of the switching slopes, with the result that they have to be protected by passive snubber components such as current rise limiting inductors and voltage rise limiting capacitors. Such snubbers comprise a number of capacitors, diodes, inductors and resistors, which have to be provided in addition to the reverse-connected parallel diode. The snubbers are likewise well known and are not explained any further at this point.

According to the invention, current and voltage rise limiting means T1 are now provided in parallel with the semiconductor switches S1 and S2. These means are designed in such a way that they can additionally take over precisely the function of the reverse-connected parallel diode. A number of circuit elements can be saved as a result.

Figure 2A:
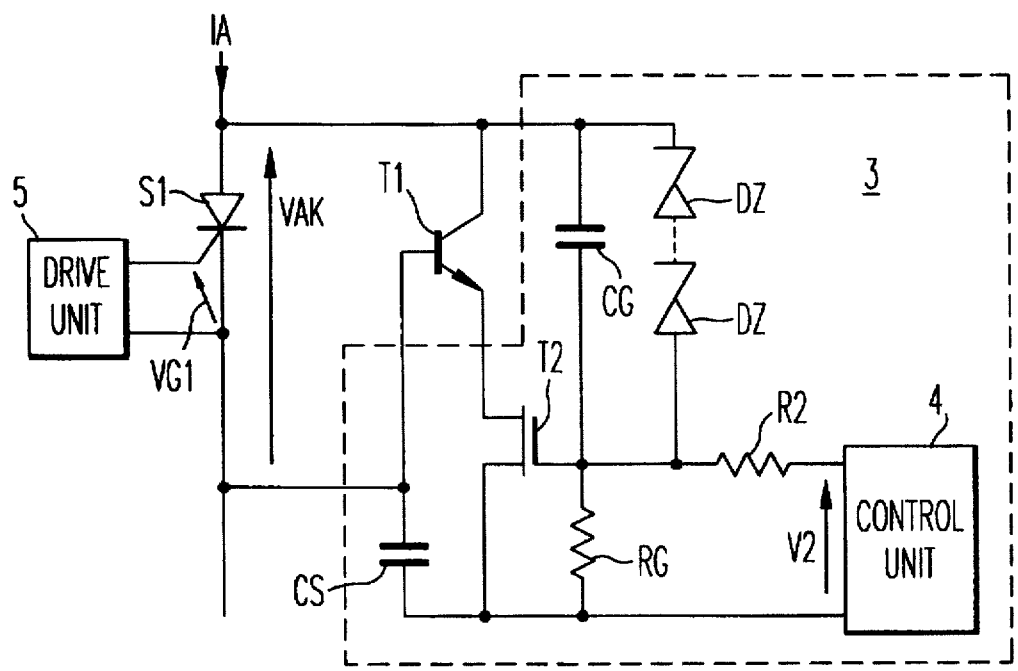
FIGS. 2A and 2B show a semiconductor switch with an equivalent circuit of the parallel-connected current and voltage rise limiting means according to the invention.

The current and voltage rise limiting means preferably comprise a bipolar transistor T1, which is connected in common base connection in parallel with the semiconductor switch S1, for example, as shown by FIG. 2A. In FIG. 2A, the base of the bipolar transistor T1 is connected to the cathode of the GTO and the collector is connected to the anode of the GTO. There is also provided a control circuit 3, which drives the bipolar transistor T1 in such a way that the latter is turned on, shortly before the semiconductor switch S1 is turned off, for a first time interval t1. The control circuit 3 is configured in such a way that, as will be explained in detail further on, active limiting of the gradient of the slope of the voltage $V_{AK}$ between the anode and the cathode of the semiconductor switch S1 is achieved (see FIG. 3).

In the event of turn-on of the semiconductor switch S1, the bipolar transistor T1 is turned on again, to be precise for a time period t2 which lasts longer than the turn-on operation of the semiconductor switch. The control voltage V2 in this case rises linearly. The control circuit 3 is designed in such a way that the rate of current rise $dI_A/dt$ through the semiconductor switch S1 can be controlled by controlling the gradient of the slope of the voltage V2.

Figure 2B:
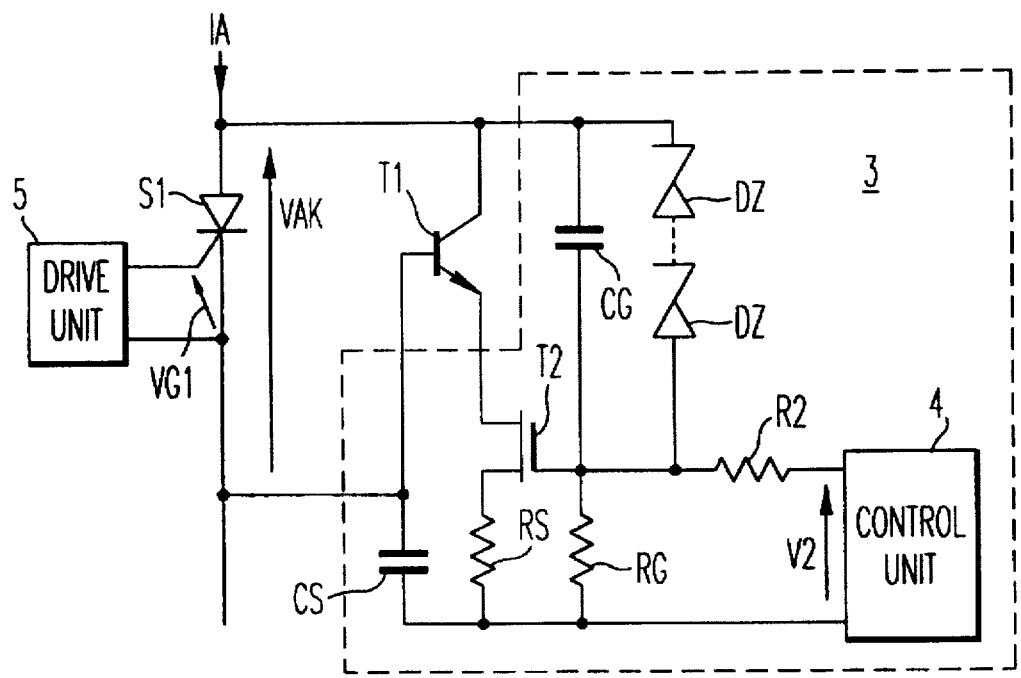

In order to satisfy the functions explained above, the control unit 3 may have the structure as illustrated in FIG. 2B. The circuit arrangement functions as follows:

Shortly before the semiconductor switch S1 is to be turned off—by appropriate driving by means of the drive unit 5, represented by the gate voltage $V_{G1}$—the bipolar transistor T1 is turned on by the application of a voltage V2 to the MOSFET T2 and consequently accepts current. This results in a small voltage hump in the profile of $V_{AK}$. The required negative voltage is in this case drawn by T2 from the capacitor $C_S$. This capacitor preferably comprises a parallel circuit of low-inductance electrolytic capacitors.

After the time interval t2—shortly after the application of the negative gate voltage $V_{G1}$—V2 is controlled to zero once again. As a result, the gate of T2 likewise goes to zero and T1 attempts to block again, that is to say the current through T2 decreases. As a result, however, the voltage $V_{AK}$ increases and a current flows via $C_G$. This current $I_{CG}=(dV_{AK}/dt)*C_G$ leads to a voltage drop in $R_G$. This produces a voltage again, which drives the transistor T2 and thus turns T1 on. This control loop permits the voltage rise $dV_{AK}/dt$ to be controlled and limited. The degree of limiting or the gradient of the slope of the voltage is in this case essentially determined by the "time constant" $C_G*(R_G||R_2)$.

The following procedure takes place in the event of turn-on of the semiconductor switch S1:

Before the sign of the gate voltage $V_{G1}$ is changed, T2 is driven by a linearly rising voltage. This produces negative current feedback via the resistor $R_S$. As a result, the drain current of T2 increases, and therefore so does $I_A$, because the bipolar transistor is after all connected in common base connection and "amplifies" this current by the factor "1". In this way, the rate of rise $dI_A/dt$ of the current $I_A$ can be set by way of the rate of voltage rise $dV_2/dt$.

With the turning on of the semiconductor switch S1 under observation, the corresponding, current-conducting switch S2 of the same branch is turned off. This results in a reverse recovery of the switch S2. This is manifested in an overshooting of the current $I_A$, designated by (1) in FIG. 3. As soon as this reverse recovery has terminated, the switch S2 takes up voltage and $V_{AK}$ is thereby reduced. The voltage V2 is now fixed and the same control procedure takes place as in the case of turn-off, with the result that the gradient of the slope of the voltage $dV_{AK}/dt$ is essentially determined by the "time constant" $C_G*(R_G||R_2)$. As soon as the voltage $V_{AK}$ has gone to zero, the sign of the gate voltage $V_{G1}$ is reversed, as a result of which the semiconductor switch S1 becomes fully on and accepts the current. The control voltage $V_2$ may also subsequently be removed after the time interval t2 has elapsed.

Figure 4B:
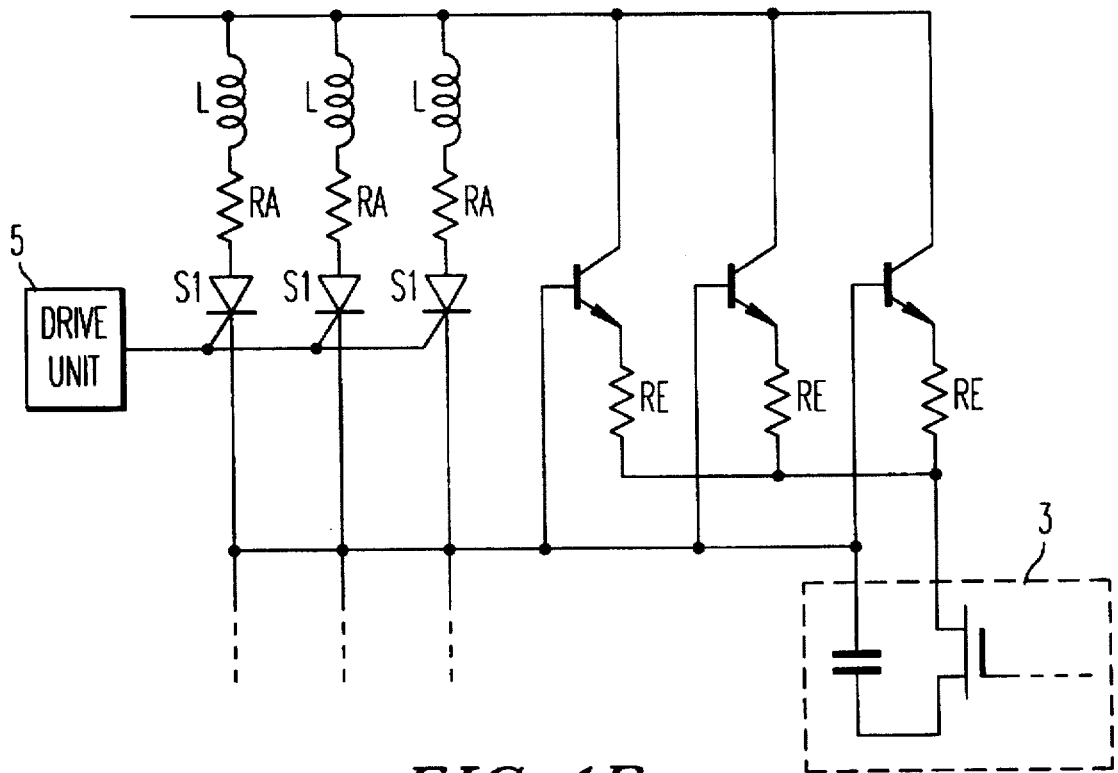
FIGS. 4A and 4B show a circuit arrangement having a plurality of semiconductor switches connected in parallel.
Figure 3A:
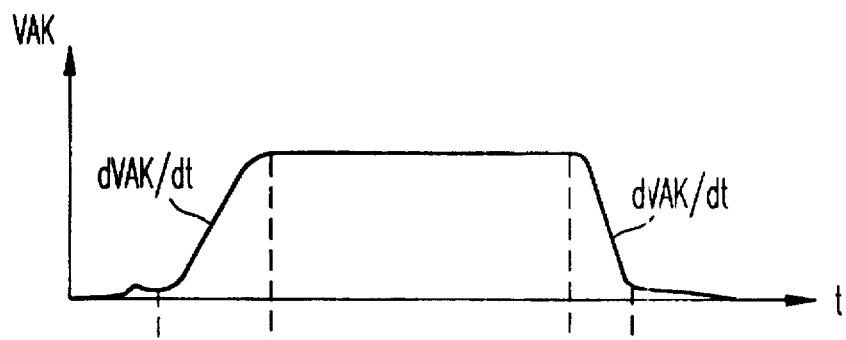
FIG. 3 shows timing diagrams for the driving of the current and voltage rise limiting means according to the invention.
Figure 3B:
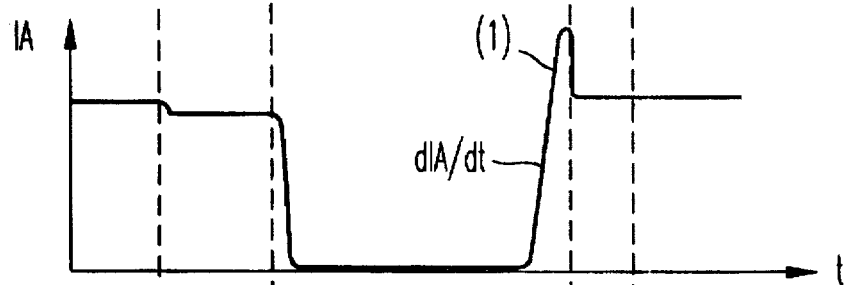
Figure 3C:
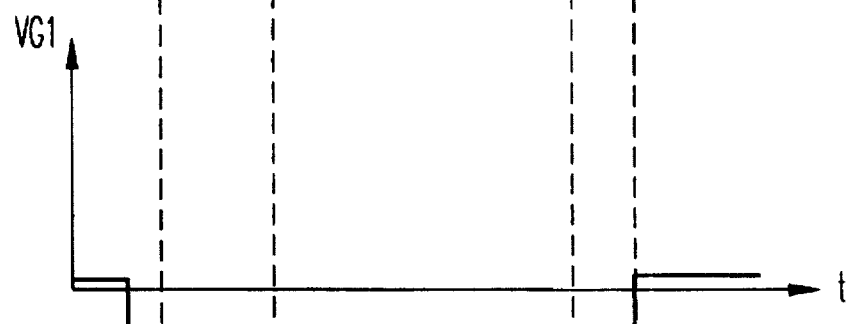
Figure 3D:
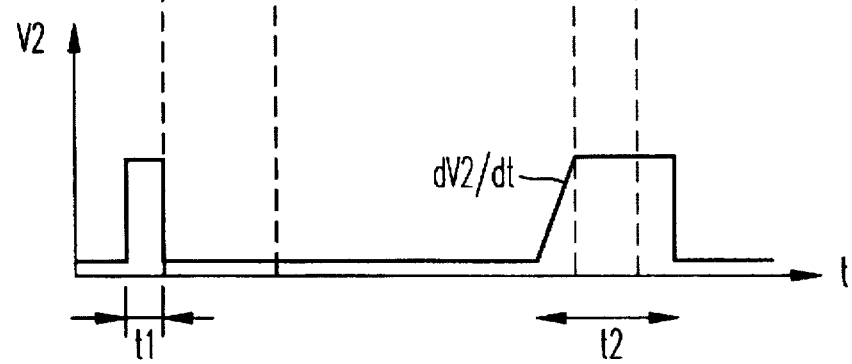
Figure 4A:
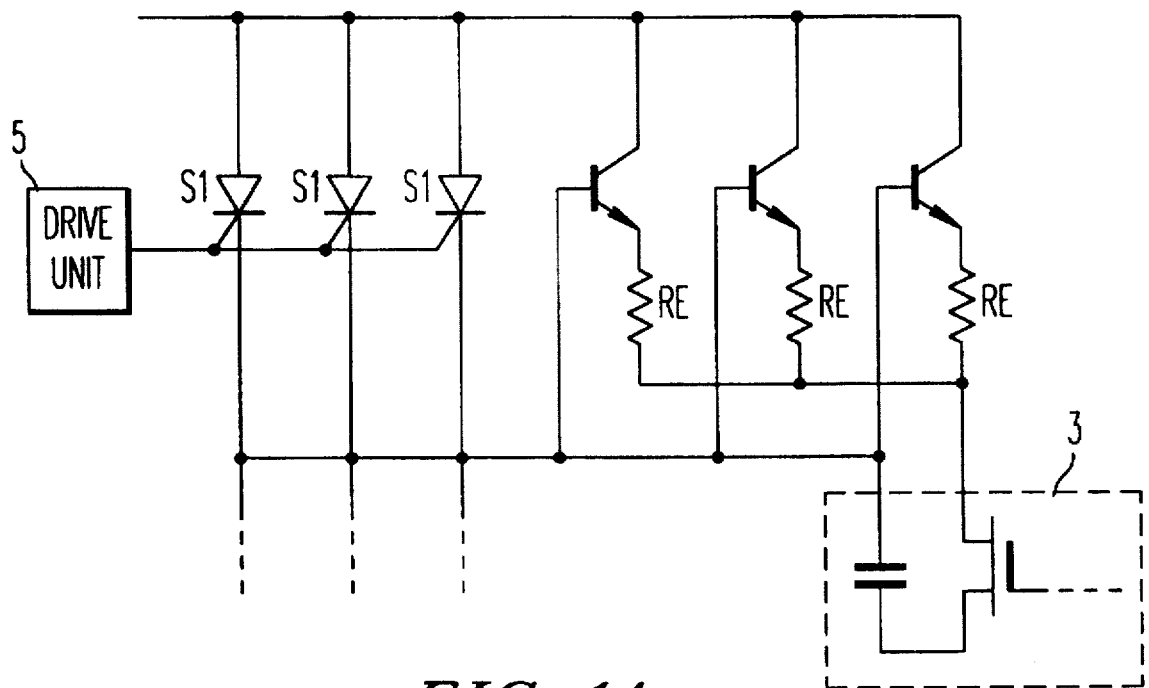

The zener diodes $D_Z$ are used for voltage limiting and are connected in parallel with $C_G$. The bipolar transistor T1 can be designed using similar technology to the GTO. It is preferably produced in such a way that its base is in direct pressure contact with the pressure contact plate, opposite the collector, of a, for example, round power semiconductor pressure contact housing. The emitter terminals are passed out at the side. Negative feedback resistors $R_E$ may also be provided (FIGS. 4A and 4B) in the emitter supply lines. This enables the current division between the individual emitter segments to be effectively compensated for. These resistors are dimensioned in such a way that there is a voltage drop of about 0.3 to 3 V at rated current. This is particularly advantageous for the parallel circuit of a plurality of semiconductor switches S1 or S2 for each branch (FIGS. 4A and 4B). The bipolar transistor is preferably installed in a low-inductance housing, as is described in EP-A2-0 588 026. A component such as the one disclosed in the above-mentioned publication is preferably used as the GTO.

The circuit arrangement according to the invention also enables the semiconductor switches S1 or S2 to be directly connected in parallel. The semiconductor switches S1, S2 are in this case driven by a common drive unit 5. The same applies to the control unit 3 of the bipolar transistors T1, which is only provided once. Small inductors L and resistors $R_A$ can also be connected upstream of the anodes of the semiconductor switches S1, S2, with the result that the current in the individual semiconductor switches remains essentially constant during varying turn-off delays on account of manufacturing tolerance (FIG. 4B).

The invention is in no way restricted to the invertor illustrated in FIG. 1, rather it can be employed in all power electronic circuit arrangements. Thus, for example, also in the rectifier connected upstream of the DC voltage intermediate circuit or in converters having a DC intermediate circuit with any desired number of phases. Overall, the invention permits the construction of circuit arrangements which manage with few circuit elements.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A converter circuit arrangement, comprising:
   at least one branch circuit connected to an intermediate circuit, including,
   at least two series connected semiconductor switches comprising GTOs, each having an actively controllable current and voltage rise limiting means connected in parallel thereto, and
   at least one load terminal formed by a central node of the series connected semiconductor switches;
   wherein the current and voltage rise limiting means comprise a bipolar transistor and a control circuit, a base of the bipolar transistor being connected to a cathode of a respective semiconductor switch and a collector of the bipolar transistor being connected to an anode of the respective semiconductor switch, and the bipolar transistor being driven by the control circuit arranged between an emitter and the base of the respective semiconductor switch.

2. The circuit of claim 1, wherein the control circuit comprises a control transistor, a first capacitor, a second capacitor, a first and a second resistor, and a controllable voltage source, the first capacitor being connected in series with the control transistor between the base and emitter of the bipolar transistor, the voltage source being connected via the second resistor to a control electrode of the control transistor, the first resistor being arranged between the control electrode and a first main electrode of the control transistor, and the second capacitor being connected between the collector of the bipolar transistor and the control electrode of the control transistor.

3. The circuit of claim 2, wherein the control circuit is designed in such a way that the bipolar transistor is turned on, shortly before the semiconductor switches are turned off, for a first time interval and is turned on, before the semiconductor switches are turned on again, for a second time interval which lasts longer than the turn-on operation.

4. The circuit of claim 2, wherein a third resistor is provided between the control transistor and the first capacitor.

5. The circuit of claim 4, wherein the control circuit is designed in such a way that the bipolar transistor is turned on, shortly before the semiconductor switches are turned off, for a first time interval and is turned on, before the semiconductor switches are turned on again, for a second time interval which lasts longer than the turn-on operation.

\* \* \* \* \*